US012614581B2

(12) United States Patent
Akamatsu et al.

(10) Patent No.: US 12,614,581 B2
(45) Date of Patent: Apr. 28, 2026

(54) STAGGERED WRITE CONTROL FOR DUAL-INTERLOCKED CELLS

(71) Applicant: Micron Technology, Inc., Boise, ID (US)

(72) Inventors: Hiroshi Akamatsu, Atlanta, GA (US); Alex Joseph Kozlosky, Decatur, GA (US)

(73) Assignee: Micron Technology, inc., Boise, ID (US)

( * ) Notice: Subject to any disclaimer, the term of this patent is extended or adjusted under 35 U.S.C. 154(b) by 64 days.

(21) Appl. No.: 18/761,171

(22) Filed: Jul. 1, 2024

(65) Prior Publication Data

US 2025/0218494 A1     Jul. 3, 2025

Related U.S. Application Data

(60) Provisional application No. 63/614,995, filed on Dec. 27, 2023.

(51) Int. Cl.
  *G11C 11/4076*     (2006.01)
  *G11C 11/4093*     (2006.01)
  *G11C 11/4096*     (2006.01)
(52) U.S. Cl.
  CPC ...... *G11C 11/4076* (2013.01); *G11C 11/4093* (2013.01); *G11C 11/4096* (2013.01)

(58) Field of Classification Search
  CPC ............ G11C 11/4076; G11C 11/4093; G11C 11/4096; G11C 11/4125; G11C 7/1072; G11C 7/1087; G06F 3/0625; G06F 3/061; G06F 3/0635; G06F 3/0662; G06F 3/067
  USPC ...................................................... 365/233.1
  See application file for complete search history.

(56) References Cited

U.S. PATENT DOCUMENTS

2023/0223059 A1 *   7/2023   Riho ...................... G11C 5/005

* cited by examiner

*Primary Examiner* — Huan Hoang
(74) *Attorney, Agent, or Firm* — Fletcher Yoder, P.C.

(57)     ABSTRACT

Systems and methods include a memory device that includes a dual-interlocked cell (DICE) latch and upstream circuitry coupled to the DICE latch and including a common node configured to receive a control signal for an operation for the DICE latch. The upstream circuitry also includes a first divided control path coupled to common node and configured to generate a first divided control signal from the control signal. The upstream circuitry comprises a second divided control path coupled to the common node and configured to generate a second divided control signal from the control signal. The second divided control path includes a delay configured to delay the second divided control signal to stagger propagation of a potential neutron strike at the common node or upstream of the common node from the DICE latch.

17 Claims, 7 Drawing Sheets

STAGGERED WRITE CONTROL FOR DUAL-INTERLOCKED CELLS

CROSS-REFERENCE TO RELATED APPLICATIONS

This application claims priority to U.S. Provisional Application No. 63/614,995, filed Dec. 27, 2023, which is incorporated by reference herein in its entirety.

BACKGROUND

Field of the Present Disclosure

Embodiments of the present disclosure relate generally to memory devices. More specifically, embodiments of the present disclosure relate to memory devices that use dual-interlocked cells.

Description of Related Art

Generally, a computing system may include electronic devices that, in operation, communicate information via electrical signals. For example, a computing system may include a processor communicatively coupled to an integrated circuit device, such as a dynamic random-access memory (DRAM) device, a ferroelectric random-access memory (FeRAM) device, another random-access memory (RAM) device, and/or other integrated circuit devices that incorporate dual interlocked cell (DICE) latches. DICE latches may include inverting circuits and redundant nodes. DICE latches may be resistant to single neutron strikes. However, they may be much less resistant to double neutron strikes and may be unable to recover from the neutron strike causing a failure (e.g., corrupted data) of the DICE latch. Moreover, a single neutron strike at some locations upstream of the DICE latch may cause a failure downstream where an upstream neutron strike mimics the behavior of a double strike at the DICE latches themselves due to separated control paths.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, although dual-interlocked cell (DICE) latches are robust against single neutron strikes to the DICE latches, they are more vulnerable to double neutron strikes occurring at the same time. One mechanism to enforce this vulnerability is to provide separated control paths for the DICE latches. However, a neutron strike at a location upstream of a DICE latch with separated control paths may cause a failure at levels similar to double neutron strikes to the DICE itself. As discussed below, staggering signals that may encounter a neutron strike upstream of the DICE latch may enable the DICE latch to recover from the propagations of the neutron strikes serially rather than both at the same that may make it impossible to recover as the propagation of a single neutron strike in separated control paths mimics a double neutron strike that may cause a data failure.

Figure 1:
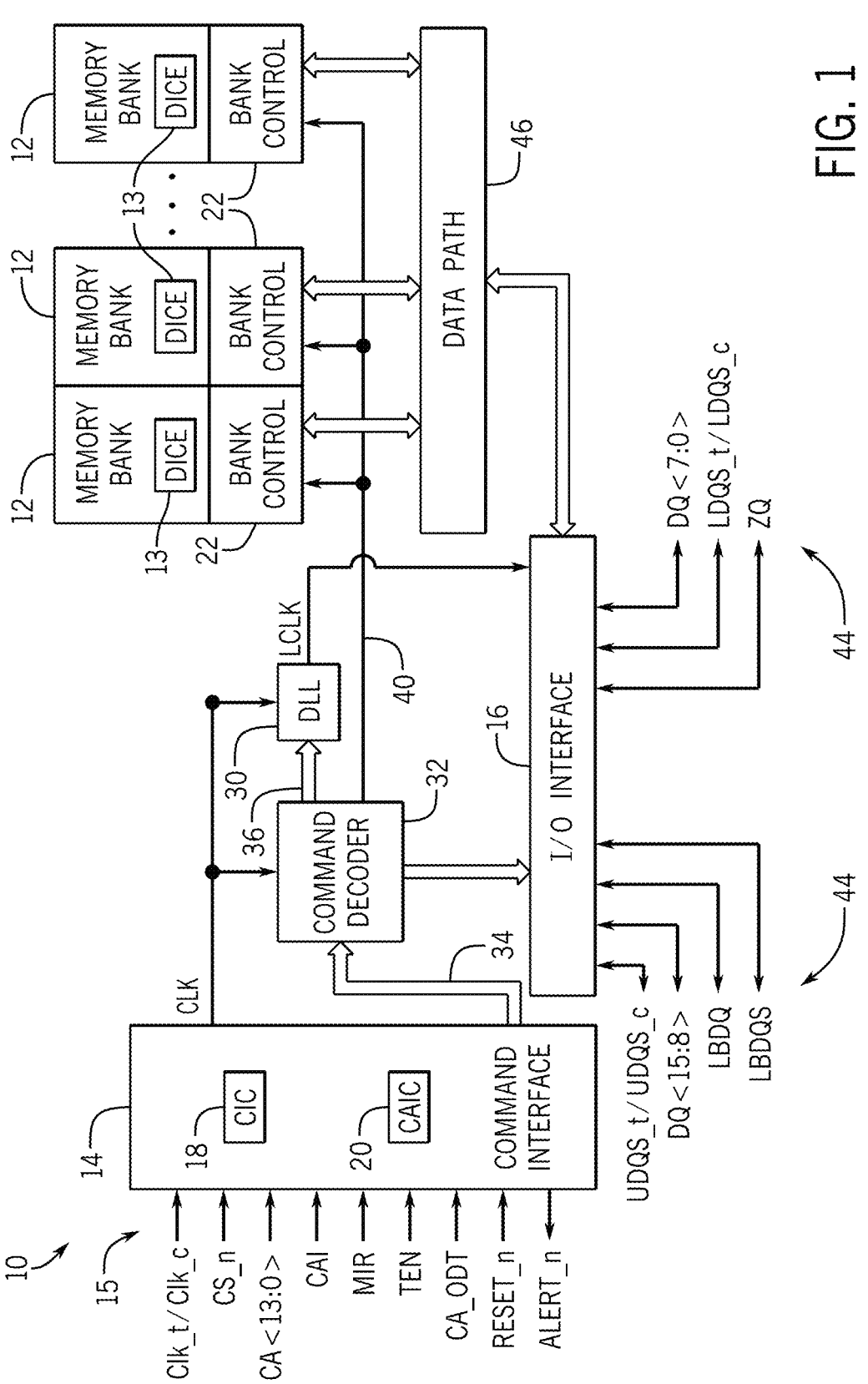
FIG. 1 is a block diagram of a memory device that utilizes a dual-interlocking cell (DICE) latch, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random-access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory banks 12 and/or bank control blocks 22 include dual interlocked cell (DICE) latches 13. As previously noted, DICE latches may be used to store information in a way that is robustly resistant to single neutron strikes but may be vulnerable to double neutron strikes.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar/complementary clock signal Clk_c. The positive clock edge for DDR refers to the point where the rising true clock signal Clk_t crosses the falling complementary clock signal Clk_c, while the negative clock edge indicates transition of the falling true clock signal Clk_t and the rising of the complementary clock signal Clk_c. Commands (e.g., read command, write command, activate command, precharge command, etc.) are typically entered on the positive edges of the clock signal and data is transmitted or received on both the positive and negative clock edges.

The clock input circuit 18 receives the true clock signal Clk_t and the complementary clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, precharge commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device 10 as being a DDR5 device, the memory device 10 may be any suitable device (e.g., a low-power double data rate (LPDDR) device, a double data rate type 4 DRAM (DDR4) device, another DRAM type, or a combination of different types of devices) that may deploy DICE latches.

Figure 2:
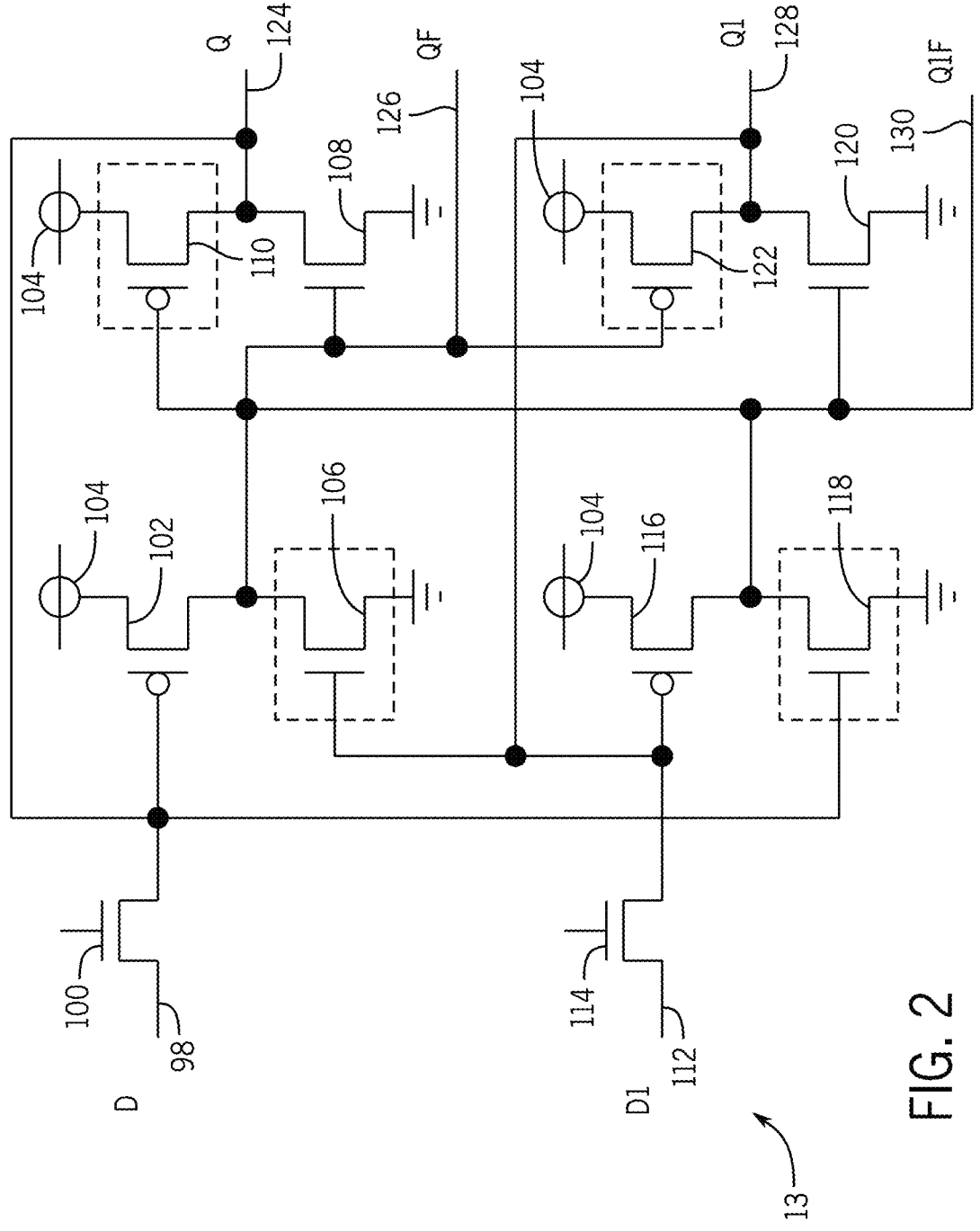
FIG. 2 is a circuit diagram of the DICE latch of FIG. 1 having critical nodes, according to an embodiment of the present disclosure.

FIG. 2 is a circuit diagram of an embodiment of the DICE latch 13. The illustrated embodiment of the DICE latch 13 receives a first signal 98 at a first terminal of an n-channel metal-oxide semiconductor (NMOS) transistor 100. For instance, the first signal 98 may be a signal used to aid in capturing data via (e.g., a gate terminal of) the NMOS transistor 100. A second terminal of the NMOS transistor 100 is coupled to a gate terminal of a p-channel metal-oxide semiconductor (PMOS) transistor 102. A first terminal of the PMOS transistor 102 is coupled to a supply voltage 104 (e.g., VPERI), and a second terminal of the PMOS transistor 102 is coupled to a first terminal of an NMOS transistor 106. A second terminal of the NMOS transistor 106 is coupled to ground (e.g., VSS). The second terminal of the PMOS transistor 102 and the first terminal of the NMOS transistor 106 are coupled to a gate terminal of an NMOS transistor 108. A first terminal of the NMOS transistor 108 is coupled to ground, and a second terminal of the NMOS transistor 108 is coupled to a first terminal of a PMOS transistor 110. A second terminal of the PMOS transistor 110 is coupled to the supply voltage 104.

The illustrated embodiment of the DICE latch 13 also receives a second signal 112 at a first terminal of an NMOS transistor 114. For instance, the second signal 112 may be a signal used to aid in capturing data via (e.g., a gate terminal of) the NMOS transistor 114. A second terminal of the NMOS transistor 114 is coupled to a gate terminal of a PMOS transistor 116. A gate terminal of the PMOS transistor 116 is also coupled to a gate terminal of the NMOS transistor 106. A first terminal of the PMOS transistor 116 is coupled to the supply voltage 104, and a second terminal of the PMOS transistor 116 is coupled to a first terminal of an NMOS transistor 118. A second terminal of the NMOS transistor 118 is coupled to ground (e.g., VSS). A gate terminal of the NMOS transistor 118 is coupled a gate terminal of the PMOS transistor 102. The second terminal of the PMOS transistor 116 and the first terminal of the NMOS transistor 118 are coupled to a gate terminal of an NMOS transistor 120. The gate terminal of the NMOS transistor 120 is coupled to a gate terminal of the PMOS 110. A first terminal of the NMOS transistor 120 is coupled to ground, and a second terminal of the NMOS transistor 120 is coupled to a first terminal of a PMOS transistor 122. A second terminal of the PMOS transistor 122 is coupled to the supply voltage 104. A gate terminal of the PMOS transistor 122 is coupled to a gate of the NMOS transistor 108. The DICE latch 13 may have an output Q 124 and an output QF 126. The output QF 126 is complementary to the output Q 124. The DICE latch 13 may also have an output Q1 128 and an output Q1F 130. The output Q1F 130 is complementary to the output Q1 128.

Figure 3:
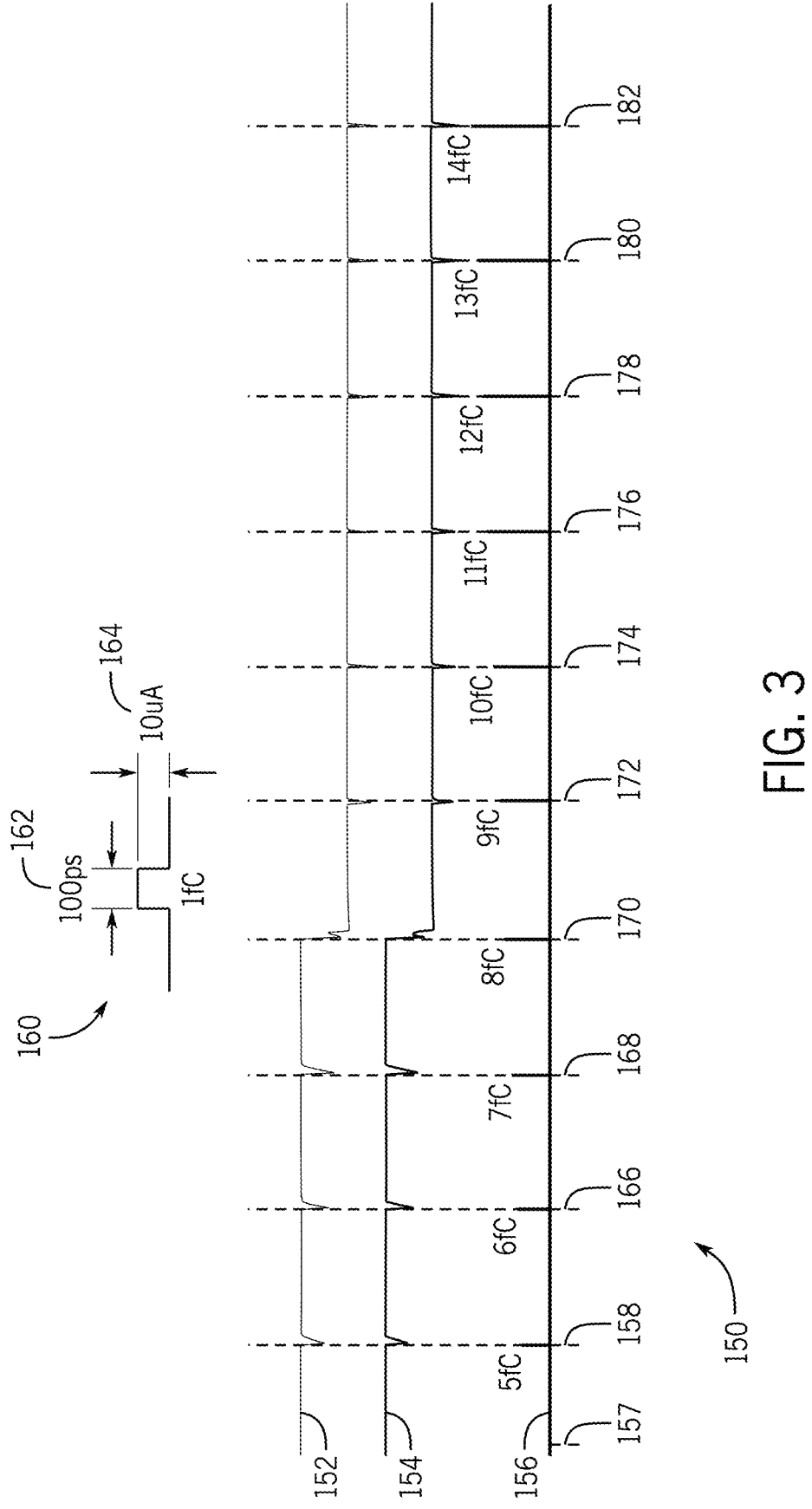
FIG. 3 is a graph of neutron strikes and the impact of the neutron strikes at the critical nodes of the DICE latch of FIG. 2, according to an embodiment of the present disclosure.

As previously noted, if a neutron strike occurs at one node (e.g., the output Q 124 or the output Q1 128) of the DICE latch 13 below a relatively high threshold (e.g., 100+ picocoulomb (PC)) of current injection (as negative noise), the DICE latch 13 is able to recover from the strike. However, if two nodes are struck, the DICE latch 13 may fail above some Qcrit threshold that is much lower than the relatively high threshold. For instance, FIG. 3 shows a graph 150 of a voltages at nodes in response to different amounts of energy (e.g., current) injected during neutron strikes. The graph 150 includes a line 152 that corresponds to a voltage at a first node (e.g., the output Q 124) and a line 154 that corresponds to a voltage at a second node (e.g., the output Q1 128). The graph 150 includes a line 156 that corresponds to the energy/current injected by a neutron strike. At an initial time 157, data is stored at the first and second nodes as a logic high. At time 158, noise (e.g., negative noise) is injected with an amount of noise (e.g., 5 femtocoulombs (fC)) from which the first and second nodes recover and maintain the logic at the first and second nodes. An example of an fC is illustrated in the graph 160 showing that an fC equals an amount of energy injected by a pulse having a duration 162 of 100 picoseconds (ps) and an amplitude of 10 microamps (μA) or some other equivalent amount of energy with different durations or amplitudes. At times 166 and 168, the first node and the second node recover from respective noise levels (e.g., 6fC, 7fC). However, at time 170, the noise (e.g., 8fC) causes the first node and the second node to be flipped from a logic high to a logic low. This value is designated as the Qcrit where the logic fails due to the double neutron strike. Likewise, any of the noise levels (e.g., 9fC, 10fC, 11fC, 12fC, 13fC, or 14fC) at times 174, 176, 178, 180, or 182 may cause the logic values at the first node and the second node to flip if the stored value is a logic high when the double neutron strikes occur. As previously noted, the DICE latch 13 may be resistant to single neutron strikes even when the injected current is up over 100 pC. However, double neutron strikes of a fraction (e.g., less than $1/10{,}000^{th}$ or at 10 fC) of the energy of a single strike may cause the stored data to fail. To address such vulnerabilities, the DICE latch 13 may be deployed with a layout that provides a relatively large distance (e.g., 0.5 μm) between critical nodes (e.g., the Q output 124 and the Q1 output 128) to make it less likely that both critical nodes are struck at the same time. Another mechanism to provide a more robust protection includes separating the access transistors (e.g., the NMOS transistors 100 and 114), gate signals, and data input signals to the DICE latch 13.

Figure 4:
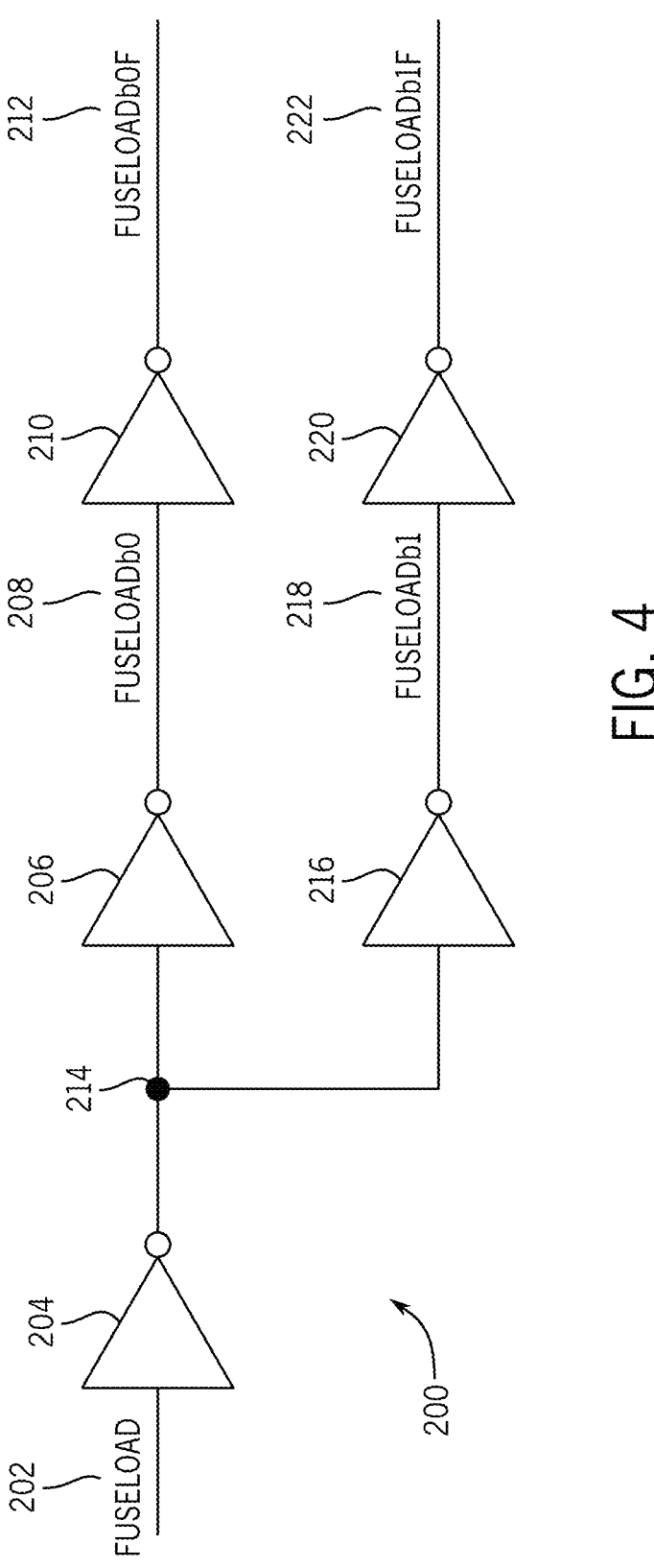
FIG. 4 is a circuit diagram of upstream circuitry using divided control signals to control operations of a DICE latch, according to an embodiment of the present disclosure.

FIG. 4 is a circuit diagram of upstream circuitry 200 that includes separated control paths (e.g., access transistors, gate signals, data input signals, etc.) to the DICE latch 13. The upstream circuitry 200 receives a fuseLoad signal 202 at an inverter 204 that may act as a control signal for the DICE latch 13 that is a control signal that enables an operation (e.g., a data write operation). An output of the inverter 204 is input to an inverter 206 to generate a first instance of a separated control signal or a first divided control signal, a fuseLoadb0 signal 208. The fuseLoadb0 signal 208 is sent to an inverter 210 to generate a fuseLoadb0F signal 212 that is complementary to the fuse-Loadb0 signal 208.

From a node 214 between the inverter 204 and the inverter 206, an inverter 216 generates a second instance of a separated control signal or a second divided control signal, a fuseLoadb1 signal 218. The fuseLoadb1 signal 218 is inverted in an inverter 220 to generate a fuseLoadb1F signal 222 that is complementary to the fuseLoadb1 signal 218. In some embodiments, at least some of the various inverters may be inverting amplifiers configured to amplify the signals being inverted in the respective inverters.

Figure 5:
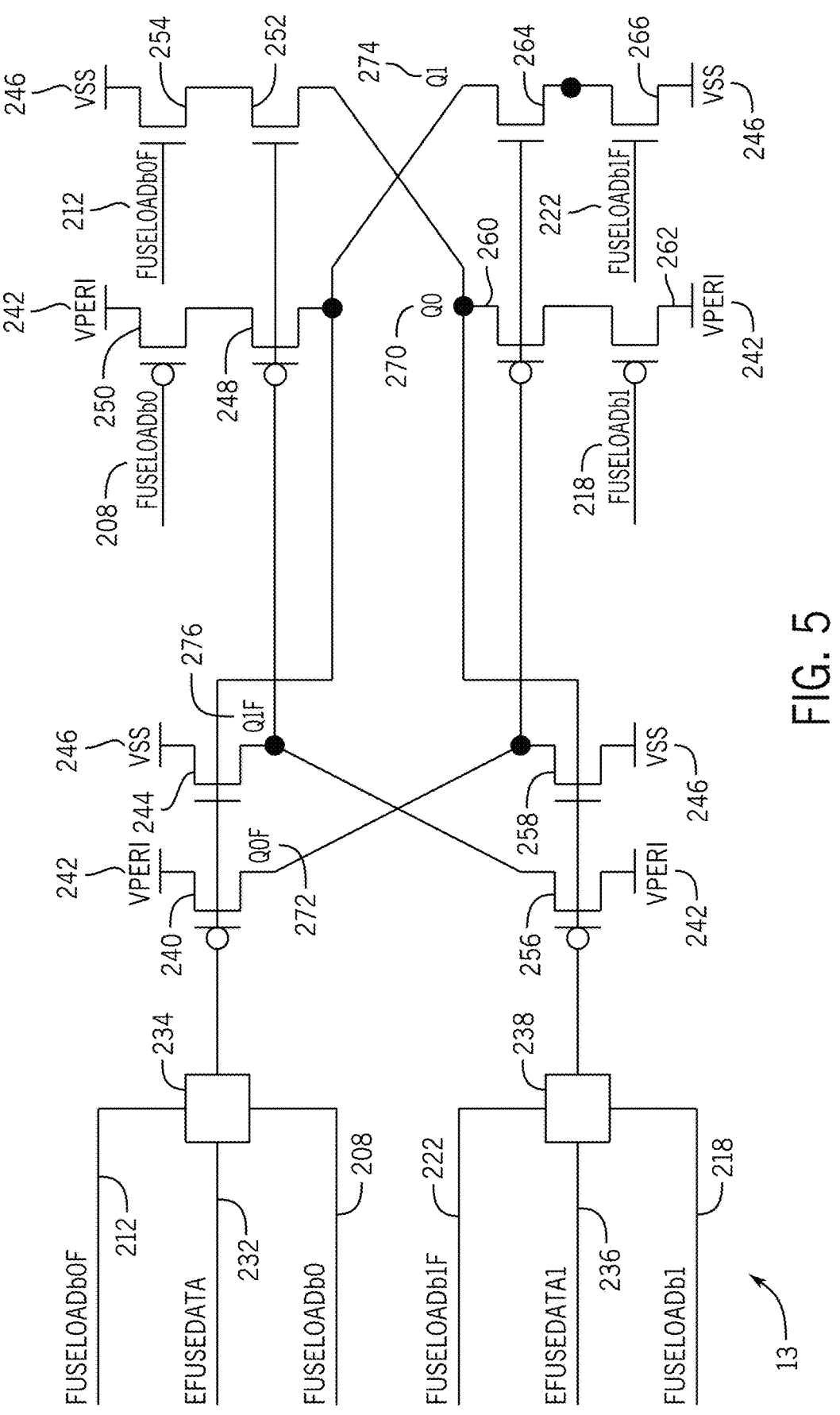
FIG. 5 is a circuit diagram of a DICE latch configured to receive the divided control signals from the upstream circuitry of FIG. 4, according to an embodiment of the present disclosure.

FIG. 5 is a circuit diagram of the DICE latch 13 in an embodiment configured to couple to the separated control paths of the upstream circuitry. The illustrated embodiment of the DICE latch 13 receives an Efusedata signal 232 (a data signal) along with the fuseLoadb0F signal 212 and the fuseLoadb0 signal 208 at a complementary metal-oxide semiconductor (CMOS) 234. The illustrated embodiment of the DICE latch 13 also receives an Efusedata1 signal 236 (a data signal) along with the fuseLoadb1F signal 222 and the fuseLoadb1 signal 218 at a CMOS 238.

The CMOS 234 is coupled to a gate terminal of a PMOS transistor 240. A first terminal of the PMOS transistor 240 is coupled to VPERI 242. The CMOS 234 is also coupled to a gate terminal of an NMOS transistor 244. A first terminal of the NMOS transistor 244 is coupled to VSS 246.

The CMOS 234 is further coupled to a first terminal of a PMOS transistor 248. A second terminal of the PMOS transistor 248 is coupled to a first terminal of a PMOS transistor 250, and a gate terminal of the PMOS transistor 248 is coupled to a second terminal of the NMOS transistor 244. The PMOS transistor 250 has a second terminal coupled to the VPERI 242 and a gate terminal coupled to the fuseLoadb0 signal 208. The gate terminal of the PMOS transistor 248 is also coupled to a gate terminal of an NMOS transistor 252 that has a first terminal coupled to a first terminal of an NMOS transistor 254. A second terminal of the NMOS transistor 254 is coupled to the VSS 246, and a gate terminal of the NMOS transistor 254 is coupled to the fuseLoadb0F signal 212.

The CMOS 238 is coupled to a gate terminal of a PMOS transistor 256. A first terminal of the PMOS transistor 256 is coupled to the VPERI 242, and a second terminal of the PMOS transistor 256 is coupled to a second terminal of the NMOS transistor 244. The CMOS 238 is also coupled to a gate terminal of an NMOS transistor 258. A first terminal of the NMOS transistor 258 is coupled to the VSS 246, and a second terminal of the NMOS transistor 258 is coupled to a second terminal of the PMOS transistor 240.

The CMOS 238 is further coupled to a first terminal of a PMOS transistor 260. A second terminal of the PMOS transistor 260 is coupled to a first terminal of a PMOS transistor 262, and a gate terminal of the PMOS transistor 260 is coupled to the second terminal of the NMOS transistor 258. The PMOS transistor 262 has a second terminal coupled to the VPERI 242 and a gate terminal coupled to the fuseLoadb1 signal 218. The gate terminal of the PMOS transistor 260 is coupled to a gate terminal of an NMOS transistor 264 that has a first terminal coupled to a first terminal of an NMOS transistor 266. A second terminal of the NMOS transistor 264 is coupled to a first terminal of the PMOS transistor 248. A second terminal of the NMOS transistor 266 is coupled to the VSS 246, and a gate terminal of the NMOS transistor 266 is coupled to the fuseLoadb0F signal 212.

The DICE latch 13 also includes a critical node Q0 270 at or between the first terminal of the PMOS transistor 260, the second terminal of the NMOS transistor 252, the gate terminal of the PMOS transistor 256, the gate terminal of the NMOS transistor 258, and/or the CMOS 238. A complementary node Q0F 272 may be located at or between the second terminal of the PMOS transistor 240, the second terminal of the NMOS transistor 258, the gate terminal of the PMOS transistor 260, and/or the gate terminal of the NMOS transistor 264. The DICE latch 13 further includes a critical node Q1 274 at or between the second terminal of the NMOS transistor 264, the first terminal of the PMOS transistor 248, the gate terminal of the PMOS transistor 240, the gate terminal of the NMOS transistor 244, and/or the CMOS 234. A complementary node Q1F 276 may be located at or between the second terminal of the NMOS transistor 244, the second terminal of the PMOS transistor 256, the gate terminal of the PMOS transistor 260, and/or the gate terminal of the NMOS transistor 264.

Figure 6:
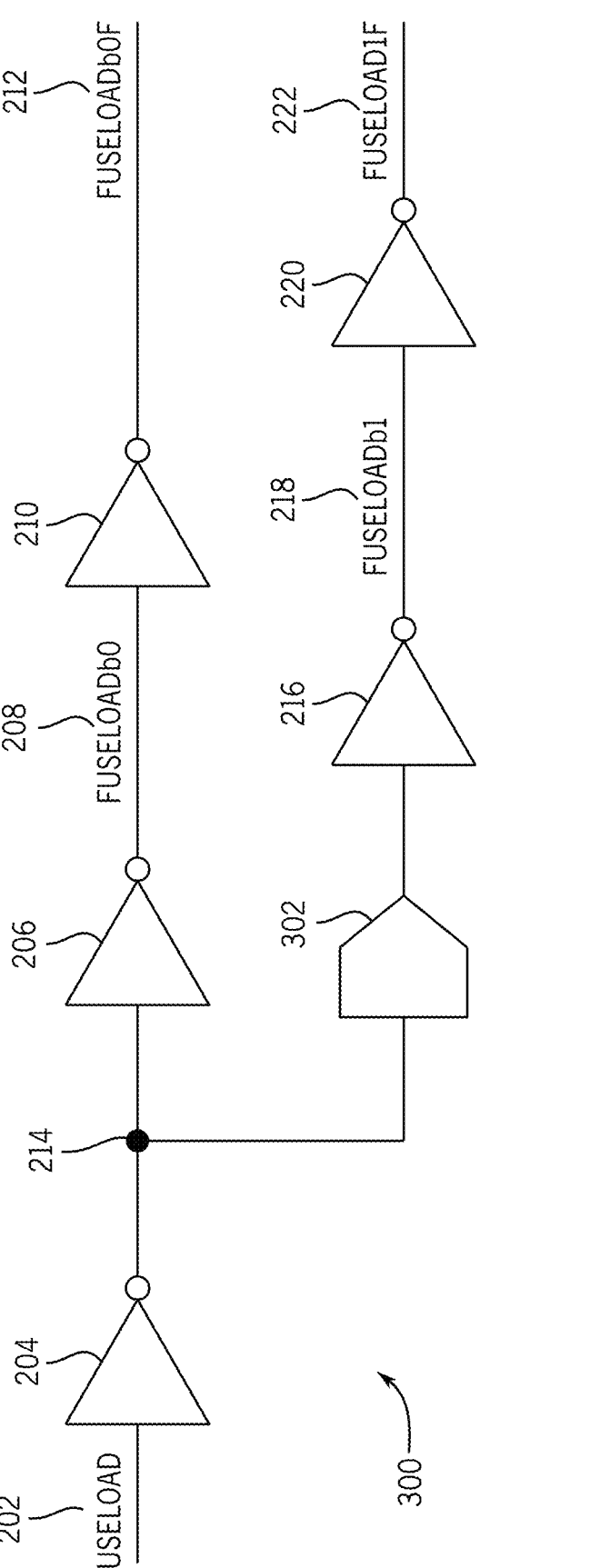
FIG. 6 is a circuit diagram of upstream circuitry configured to generate staggered and divided control signals and to drive operations of the DICE latch of FIG. 5, according to an embodiment of the present disclosure.

Physically separating the critical nodes of the DICE latch 13 may increase rigidity against double neutron strikes to the DICE latch 13 itself. Furthermore, the separated control paths of FIGS. 4 and 5 may provide rigidity to neutron strikes to the fuseLoadb0 signal 208, the fuseLoadb0F signal 212, the fuseLoadb1 signal 218, or the fuseLoadb1F signal 222 in addition to the DICE latch 13 itself. However, as previously noted, if a single neutron strike occurs upstream of the DICE latch 13, the noise may be propagated via the separated paths that impact the DICE latch 13. For instance, a single neutron strike at the fuseLoad signal 202 or the node 214 of FIG. 4 may propagate along both paths and to the DICE latch 13 causing the propagating impacts of the neutron strike to overlap at the critical nodes potentially causing stored data values to incorrectly flip logic. To address this overlapping or simultaneous propagation that may mimic a double neutron strike, one of the control paths may be delayed. For instance, FIG. 6 shows a circuit diagram of upstream circuitry 300 that may be similar to the upstream circuitry 200 of FIG. 4 except that the upstream circuitry 300 includes a delay 302 in the second divided control path. The delay 302 is included to stagger propagation of any upstream neutron strikes, such as at the node 214. In some embodiments, the delay 302 may have a duration that is sufficient to allow the DICE latch to at least partially recover from propagation of the neutron strike via one control path (e.g., via the fuseLoadb0 signal 208, etc.) before propagating the neutron strike via the other control path. In some embodiments, the duration (e.g., 100-200 ps) may be the at least the length (e.g., 100 ps) of a total recovery of the DICE latch 13 from a neutron strike of a given strength. In some embodiments, the delay element of the delay 302 may be adjustable using metal option display cells. The additional delay may increase area for the delay elements, but the tradeoff is for increased reliability. Furthermore, in some embodiments, the delay 302 may not impact the timing of write operations to the DICE latch 13 as the write timing margins by the staggered write control may be unproblematic.

Figure 7:
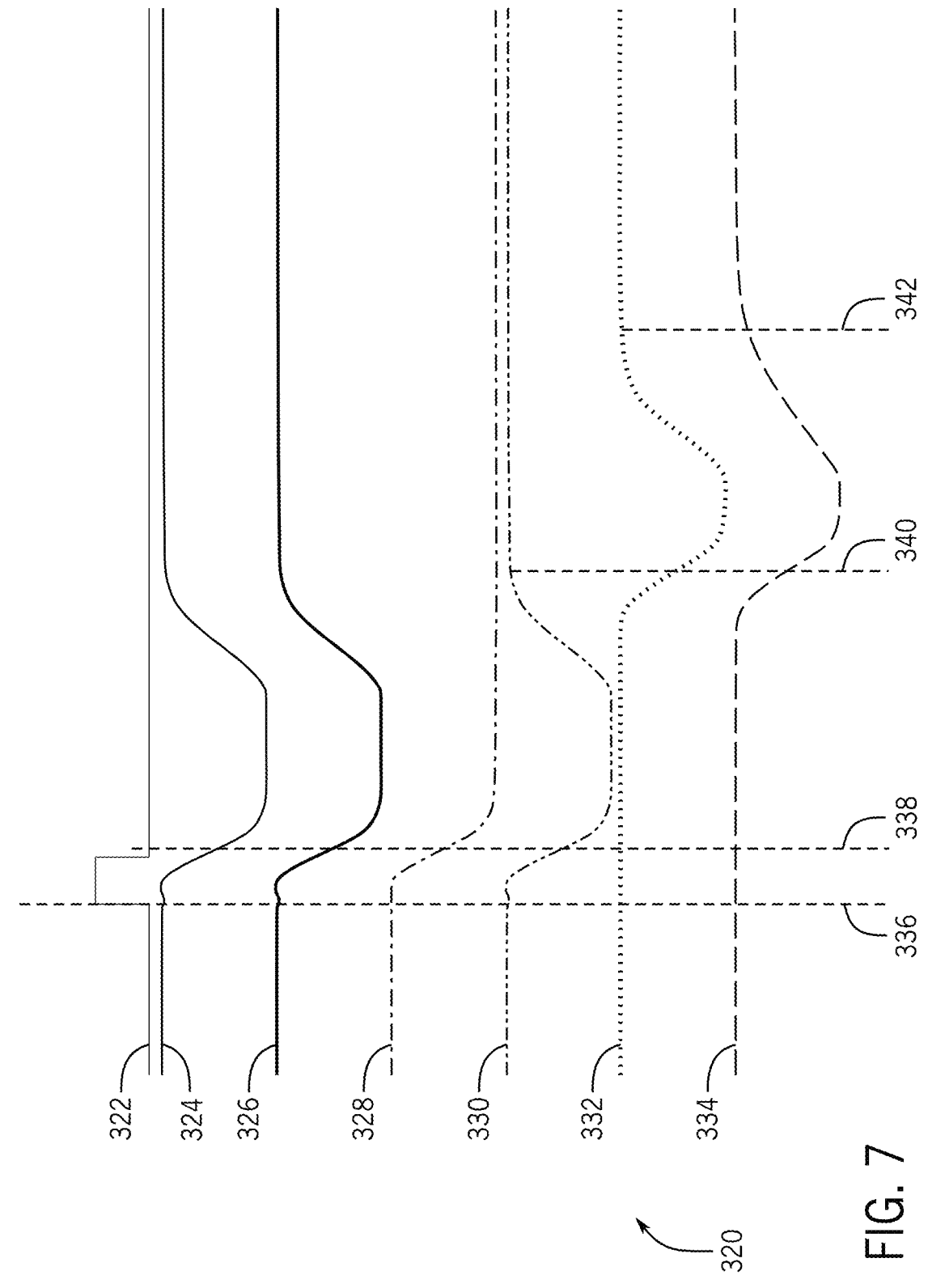
FIG. 7 is a timing diagram showing responses of the DICE latch of FIG. 5 when a neutron strike occurs in the upstream circuitry of FIG. 4 and when a neutron strike occurs in the upstream circuitry of FIG. 6, according to an embodiment of the present disclosure.

FIG. 7 shows a timing diagram 320 of an operation (e.g., a write operation) of a DICE latch 13. The timing diagram 320 includes a line 322 that corresponds to current injection resulting from a neutron strike upstream of the DICE latch 13. For example, the current injection may occur at the node 214 where the control paths split for the DICE latch 13 or upstream of the node 214 from the DICE latch 13. Lines 324, 326, and 328 correspond to an embodiment of the DICE latch 13 that does not include the delay 302 to stagger the propagation through the divided control paths. Lines 330, 332, and 334 correspond to an embodiment of the DICE latch 13 that includes the delay 302 to stagger the propagation through the divided control paths. Specifically, the line 324 corresponds to the fuseLoadb0F signal 212, and the line 326 corresponds to the fuseLoadb1F signal 222 for the upstream circuitry 200 of FIG. 4. The line 326 corresponds to a voltage of data stored in DICE latch 13, such as at one of the critical nodes (e.g., critical node Q0 270 of FIG. 5). As illustrated, when the current is injected as indicated by a pulse shown on the line 322 at time 336, both the fuseLoadb0F signal 212 indicated by line 324 and the fuseLoadb1F signal 222 indicated by the line 326 propagate the noise at least partially simultaneously (i.e., with some overlap) causing them both to drop from a logic high to a logic low at time 338. This at least partially simultaneous propagation and dropping causes the logic value stored at the critical node to flip as illustrated by the drop of the line 328 at time 338 with the logic value remaining at a logic low without recovering from the propagated noise/neutron strike.

The line 330 corresponds to the fuseLoadb0F signal 212 of the upstream circuitry 300 of FIG. 6, and the line 332 corresponds to the fuseLoadb1F signal 222 that has a delay that staggers propagation of potential neutron strikes/noise that occur upstream of the DICE latch 13 of the upstream circuitry 300 of FIG. 6. The line 334 corresponds to a voltage of data stored in DICE latch 13, such as at one of the critical nodes (e.g., critical node Q0 270 of FIG. 5). As illustrated, when the current is injected as indicated by the pulse shown on the line 322 at time 336, only the fuseLoadb0F signal 212 indicated by line 330 propagates the noise before time 340. Propagation of the neutron strike/ noise to the fuseLoadb1F signal 222 is blocked until after time 340 to stagger the injection of charge in the DICE latch 13 via the control paths. The amount of delay in the delay 302 corresponds to a difference in time between the time 338 and the time 340. By delaying propagation of the fuseLoadb1F signal 222, the voltage at the critical node indicated by the line 334 is able to recover by time 342 and does not switch logic values. Thus, the staggering of the control paths using the delay 302 enables the DICE latch 13 to more robustly resist neutron strikes even when they occur upstream of the DICE latch 13 and the node 214.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:

a dual-interlocked cell (DICE) latch; and upstream circuitry coupled to the DICE latch and comprising:

a common node configured to receive a control signal for an operation for the DICE latch;

a first divided control path coupled to the common node and configured to generate a first divided control signal from the control signal; and a second divided control path coupled to the common node and configured to generate a second divided control signal from the control signal, wherein the second divided control path comprises a delay configured to delay the second divided control signal to stagger propagation of a potential neutron strike at the common node or upstream of the common node from the DICE latch, wherein the delay has a duration of a length of time configured to enable the DICE latch to recover from propagation of the potential neutron strike via the second divided control path.

2. The memory device of claim 1, wherein the operation comprises a write operation for the DICE latch.

3. The memory device of claim 1, wherein the second divided control path is in parallel with the first divided control path between the common node and the DICE latch.

4. The memory device of claim 1, wherein the DICE latch comprises a first complementary metal-oxide semiconductor (CMOS) configured to receive the first divided control signal at the DICE latch from the upstream circuitry.

5. The memory device of claim 4, wherein the DICE latch comprises a second CMOS configured to receive the second divided control signal at the DICE latch from the upstream circuitry.

6. The memory device of claim 1, wherein the delay is configured to block propagation of the potential neutron strike from mimicking dual neutron strikes by propagating through the first and second control paths at least partially simultaneously by staggering propagation of the potential neutron strike in the first control path and the second control path.

7. The memory device of claim 1, wherein the first divided control path comprises a first plurality of inverting amplifiers configured to:

generate the first divided control signal;

generate a first complementary divided control signal that is complementary to the first divided control signal; and transmit the first divided control signal and the first complementary divided control signal to the DICE latch.

8. The memory device of claim 7, wherein the second divided control path comprises a second plurality of inverting amplifiers configured to:

generate the second divided control signal;

generate a second complementary divided control signal that is complementary to the second divided control signal; and transmit the second divided control signal and the second complementary divided control signal to the DICE latch.

9. The memory device of claim 1, wherein the delay is configured to enable the DICE latch to at least partially recover from the propagation of a potential neutron strike via the first divided control signal before propagating the potential neutron strike via the second divided control signal.

10. A method for operating a memory device comprising:

receiving a control signal for a dual-interlocked cell (DICE) latch;

dividing the control signal into a first divided control signal on a first divided control path and a second divided control signal on a second divided control path;

delaying the second divided control signal using a delay element in the second divided control path to stagger propagation of a potential neutron strike impacting the control signal upstream from the DICE latch;

providing the first divided control signal to the DICE latch, wherein providing the first divided control signal comprises providing the first divided control signal without a delay element in the first divided control path; and providing the delayed second divided control signal to the DICE latch.

11. The method of claim 10, wherein the first divided control path and the second divided control path are coupled in parallel between a common node dividing the control signal and the DICE latch.

12. The method of claim 10, wherein the control signal is configured to enable a write operation for the DICE latch.

13. The method of claim 10, wherein a length of delay for the delay element is set to a recovery duration that provides time for the DICE latch to at least partially recover from propagation of the potential neutron strike via the first divided control path before propagating the potential neutron strike via the second divided control path.

14. The method of claim 13, wherein the recovery duration comprises a complete length of the recovery after the propagation of the potential neutron strike via the first divided control path.

15. A memory device, comprising:

a dual-interlocked cell (DICE) latch; and upstream circuitry coupled to the DICE latch and configured to receive a control signal for an operation in the DICE latch and to provide a first divided control signal and a second divided control signal to the DICE latch, comprising:

a first divided control path configured to receive the control signal and to generate the first divided control signal from the control signal; and a second divided control path configured to generate the second divided control signal from the control signal, wherein the second divided control path comprises a delay configured to delay the second divided control signal to stagger propagation of a potential neutron strike impacting the control signal upstream of second divided control path, and staggering the propagation comprises staggering propagation of the potential neutron strike via the first divided control signal and the second divided control signal, wherein a duration of the delay is a length of time sufficient for the DICE latch to at least partially recover from propagation of the potential neutron strike via the first divided control path before propagating the neutron strike via the second divided control path.

16. The memory device of claim 15, wherein the first divided control path comprises a first plurality of inverting amplifiers configured to:

generate the first divided control signal;

generate a first complementary divided control signal that is complementary to the first divided control signal; and transmit the first divided control signal and the first complementary divided control signal to the DICE latch.

17. The memory device of claim 15, wherein the second divided control path comprises a second plurality of inverting amplifiers configured to:

generate the second divided control signal;

generate a second complementary divided control signal that is complementary to the second divided control signal; and transmit the second divided control signal and the second complementary divided control signal to the DICE latch.

* * * * *